United States Patent
Miyanishi et al.

(10) Patent No.: US 11,009,905 B2
(45) Date of Patent: May 18, 2021

(54) SEMICONDUCTOR INTEGRATED CIRCUIT AND CLOCK SUPPLY METHOD INCLUDING A SAMPLE AND HOLD CIRCUIT

(71) Applicant: Ricoh Company, Ltd., Tokyo (JP)

(72) Inventors: Isamu Miyanishi, Osaka (JP); Yuuya Miyoshi, Osaka (JP); Tohru Kanno, Kanagawa (JP); Shinji Sakaguchi, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 74 days.

(21) Appl. No.: 16/267,409

(22) Filed: Feb. 5, 2019

(65) Prior Publication Data

US 2019/0272003 A1 Sep. 5, 2019

(30) Foreign Application Priority Data

Mar. 2, 2018 (JP) .............................. JP2018-037605

(51) Int. Cl.
*G06F 1/00* (2006.01)
*G06F 1/10* (2006.01)
*H05K 1/11* (2006.01)
*H01L 23/50* (2006.01)

(52) U.S. Cl.
CPC ................ *G06F 1/10* (2013.01); *H01L 23/50* (2013.01); *H05K 1/11* (2013.01)

(58) Field of Classification Search
CPC ..... G06F 1/10; G06F 1/12; G06F 1/15; G06F 15/16; H03K 5/135
See application file for complete search history.

(56) References Cited

U.S. PATENT DOCUMENTS

| | | | | |
|---|---|---|---|---|
| 6,301,294 B1* | 10/2001 | Hara | ................... | H04B 1/7075 375/150 |
| 7,304,676 B2* | 12/2007 | Compton | ............... | H04N 5/335 348/312 |
| 2007/0058479 A1* | 3/2007 | Matsui | ................. | G11C 7/1066 365/189.18 |
| 2013/0162870 A1* | 6/2013 | Miyoshi | ............... | H04N 5/3577 348/241 |
| 2017/0263513 A1 | 9/2017 | Miyanishi et al. | | |

FOREIGN PATENT DOCUMENTS

| | | |
|---|---|---|
| JP | 2008-067250 | 3/2008 |
| JP | 2017-168531 | 9/2017 |

* cited by examiner

*Primary Examiner* — Nitin C Patel
(74) *Attorney, Agent, or Firm* — Xsensus LLP

(57) ABSTRACT

A semiconductor integrated circuit includes a plurality of processing circuits including a sample and hold circuit, and a timing signal generation circuit that receives a reference clock signal and generates a timing signal to control a timing to operate the sample and hold circuit based on the reference clock signal. The plurality of processing circuits serially execute processing in order from the processing circuit at a preceding stage to the processing circuit at a subsequent stage. The timing signal generation circuit is coupled to the plurality of processing circuits so as to supply the timing signal to each of the plurality of processing circuits in order from the processing circuit at the subsequent stage to the processing circuit at the preceding stage.

10 Claims, 10 Drawing Sheets

SEMICONDUCTOR INTEGRATED CIRCUIT AND CLOCK SUPPLY METHOD INCLUDING A SAMPLE AND HOLD CIRCUIT

CROSS-REFERENCE TO RELATED APPLICATIONS

This patent application is based on and claims priority pursuant to 35 U.S.C. § 119(a) to Japanese Patent Application No. 2018-037605, filed on Mar. 2, 2018, in the Japan Patent Office, the entire disclosure of which is hereby incorporated by reference herein.

BACKGROUND

Technical Field

The present invention relates to a semiconductor integrated circuit and a clock supply method.

Discussion of the Background Art

A semiconductor integrated circuit device including a pipeline type Analog/Digital (A/D) conversion circuit which implements high accuracy, low consumption power, and small area has been already known.

In the pipeline type A/D conversion circuit, timings of sampling and holding of circuits are matched in a processing system including a plurality of sample and hold circuits.

However, for example, with a clock supply method for distributing clock wirings in a tree like shape and inserting a buffer in each path to form a clock system, there has been a disadvantage in that a large number of buffers are inserted on a side of a circuit closer to a clock source and a circuit size increases.

SUMMARY

Example embodiments of the present invention include a semiconductor integrated circuit includes a plurality of processing circuits including a sample and hold circuit, and a timing signal generation circuit that receives a reference clock signal and generates a timing signal to control a timing to operate the sample and hold circuit based on the reference clock signal. The plurality of processing circuits serially execute processing in order from the processing circuit at a preceding stage to the processing circuit at a subsequent stage. The timing signal generation circuit is coupled to the plurality of processing circuits so as to supply the timing signal to each of the plurality of processing circuits in order from the processing circuit at the subsequent stage to the processing circuit at the preceding stage

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

Figure 1A:
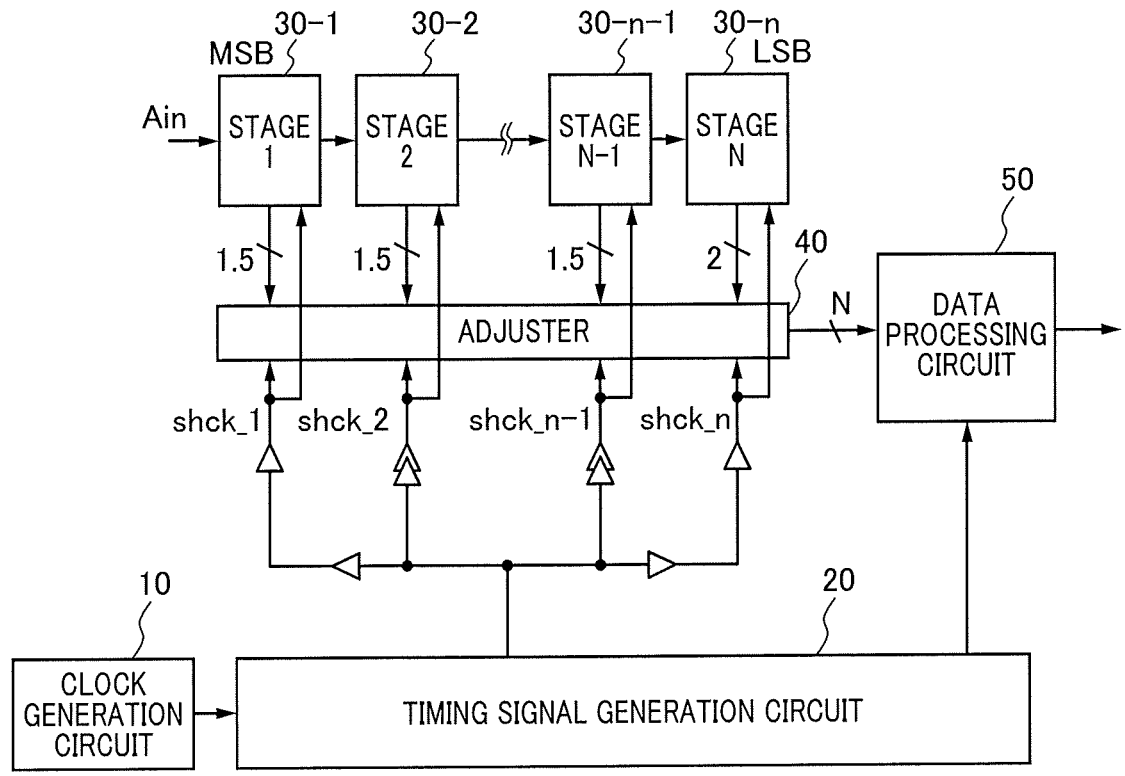
FIGS. 1A to 1C are diagrams for explaining a configuration example of a semiconductor integrated circuit to operate a pipeline ADC.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Hereinafter, embodiments will be described with reference to the drawings. To clarity of explanation, the following description and drawings are appropriately omitted or simplified. In each drawing, components having the same configuration or function and corresponding parts are denoted with the same reference numeral, and description thereof will be omitted.

First, an example of supply of a timing signal to a sample and hold circuit will be described using a pipeline Analog-to-Digital Converter (ADC) as a configuration example of a semiconductor integrated circuit in which sample and hold circuits are serially connected.

Figure 1B:
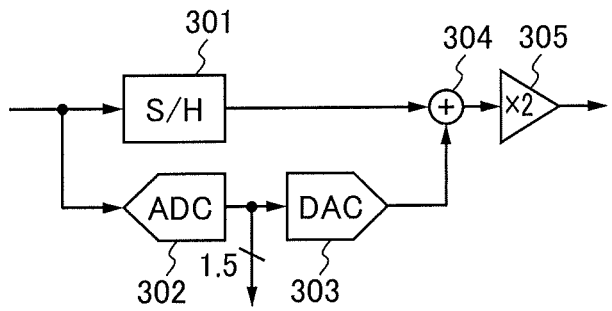
Figure 1C:
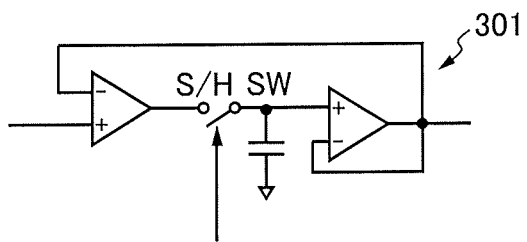

FIGS. 1A to 1C are diagrams for explaining a configuration example of a semiconductor integrated circuit to operate the pipeline ADC, FIG. 1A is an example of general arrangement of the pipeline ADC, FIG. 1B is a configuration example of the ADC, and FIG. 1C is a configuration example of the sample and hold circuit. The pipeline ADC illustrated in FIG. 1A is a configuration example of N bits (N is integer of one or more) in which the sample and hold circuits are serially connected.

The pipeline ADC is one of circuit formats for converting an analog signal into a digital signal and serially performs AD conversion in several stages. In data transmission between the plurality of stages, sampling/holding timings of the sample and hold circuits are controlled based on the timing signal.

Each stage includes an ADC 302 of 1.5 bits, a Digital-to-Analog Converter (DAC) 303 of 1.5 bits, a residual amplifier 305, and a sample and hold circuit (also referred to as "S/H circuit") 301 as components and sequentially performs AD conversion while transmitting residuals of each stage to the lower side (subsequent stage circuit) from the Most Significant Bit (MSB) to the Least Significant Bit (LSB).

An analog signal (Ain) input from an input terminal is sampled and held (sampling), in a case of the configuration example in FIGS. 1A to 1C, at the same time, the ADC 302 converts the signal into a three-valued (1.5 bits) digital value. In a case where a reference voltage is Vref, Ain≤−Vref/4 is converted into a digital value of "00", −Vref/4<Ain≤+Vref/4 is converted into a digital value of "01", and +Vref<Ain is converted into a digital value of "10". The DAC 303 converts the converted digital values into analog values, for example, "00" is converted into −Vref/2, "01" is converted into 0, and "10" is converted into +Vref/2. A value obtained by subtracting a DAC output voltage from the sample-and-hold voltage is doubled by the residual amplifier 305, and the obtained value is sent to the next stage.

In this way, by setting the digital value output of each stage to 1.5 bits, it is possible that an offset voltage between the ADC (comparator) and the residual amplifier in each stage (from stage 1(30-1) to stage N(30-N)) does not affect conversion characteristics. A digital correction circuit of an adjuster (delay adjustment and digital correction) 40 can receive data of which an error has been corrected at the time of conversion at the subsequent stage even when an error occurs in conversion in a preceding stage.

To output the data processed in each stage as an N-bit digital conversion value at the end, a delay adjustment circuit of the adjuster 40 adjusts a processing time (the number of clocks) in each stage.

Since the input analog signal (Ain) requires the number of clocks for the number of stages until the AD conversion is performed on the MSB to the LSB and the data is determined, at least a time for the number of stages (the number of clocks, latency) is required until the analog signal (Ain) is converted into an N-bit digital signal.

A semiconductor integrated circuit having the pipeline ADC thereon includes a clock generation circuit 10 to generate a clock signal to be a clock source which is directly provided outside or provided inside the semiconductor integrated circuit.

A timing signal generation circuit 20 generates a frame or a line synchronization signal to be a trigger (start reference) of the AD conversion in the semiconductor integrated circuit based on the clock signal and outputs a timing signal (for example, sample and hold clock signal (S/H clock signal): shck_1, shck_2, . . . , shck_n) as a control clock at a necessary timing. The timing signal controls a sample and hold switch (S/H_SW) of the S/H circuit 301.

The AD converted data is output to the other processing block (not illustrated) or outside via a data processing circuit 50.

As described above, it is necessary for the pipeline ADC to sequentially operate the sample and hold circuits such as, sampling and holing the analog signal (Ain), sending the residuals to the next stage, and sampling and holding.

Next, a disadvantage in supply of the timing signal as the control clock will be described.

Figure 2:
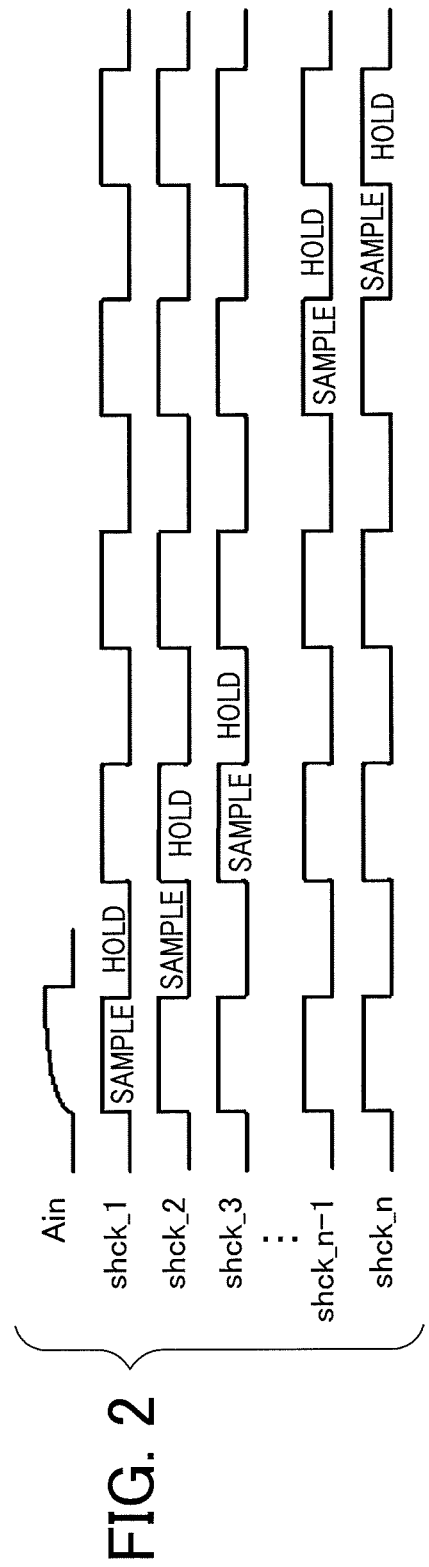
FIG. 2 is a diagram for explaining a sample and hold timing in FIGS. 1A to 1C.

FIG. 2 is a diagram for explaining a sample and hold timing (control clock) in FIGS. 1A to 1C. In general, the sample and hold clock signals (shck_1, . . . , shck_n) to the respective stages of the pipeline ADC which are generated by the timing signal generation circuit 20 are designed so that timings are matched at positions (input end) where the signals are input to the stages as illustrated in FIG. 2. For easy understanding and convenience of description regarding an operation, the sample and hold clock signal (shck_1, . . . , shck_n) input to each stage illustrated in FIG. 2 is written with a logic in which data which is sampled (SAMPLE) at High and held (HOLD) at Low in the stage 1 is sampled at the hold timing (Low) in the stage 1 and held at High in the stage 2.

On the premise that the timings of the sample and hold clock signals are matched at the input end of each stage, in each stage, a timing is adjusted so that the next stage starts at a desired timing (hold before next sampling). If the timing adjustment is failed, data is held after the preceding stage sampled the next data. Therefore, a malfunction in the function of the ADC occurs.

Figure 3:
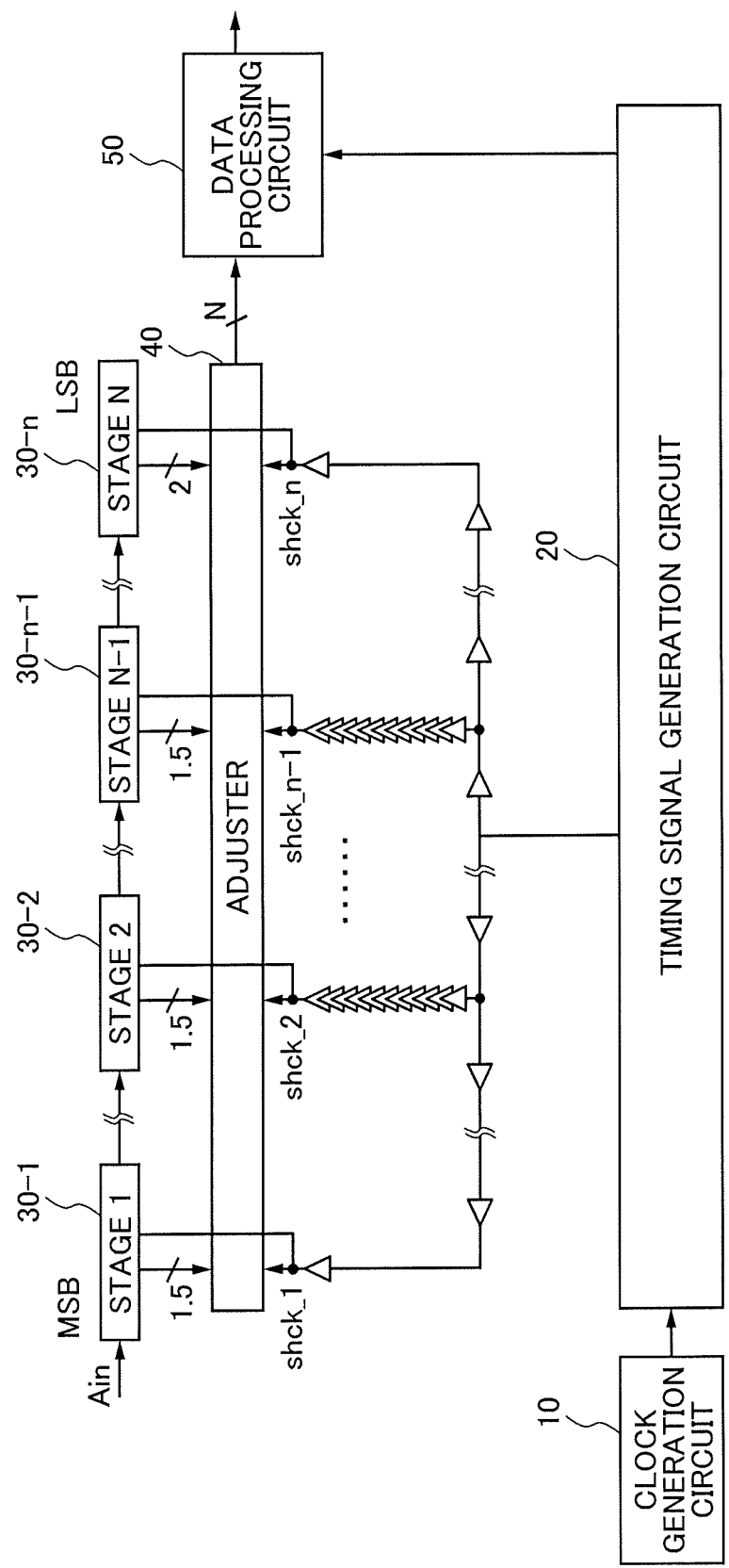
FIG. 3 is a diagram for explaining a configuration example of a semiconductor integrated circuit to operate the pipeline ADC when being physically restricted.

FIG. 3 is a diagram for explaining a configuration example of a semiconductor integrated circuit to operate the pipeline ADC when being physically restricted.

To match the sample and hold timings of the circuits in a processing system including the plurality of sample and hold circuits, similarly to a clock distribution method of a logic circuit, a technique for distributing clock wires in a tree-like shape so that timings match at the input ends of the circuits and inserting buffers into each path to form a clock system has been considered and has been already known.

Here, a case where a pipeline ADC is arranged on a chip with a high aspect ratio such as a linear sensor or a pipeline ADC is arranged in a situation with layout restriction such as arrangement in a gap between other blocks will be examined. As described above, to match the timings of the sample and hold clock signals at the input ends of the stages, as illustrated in FIG. 3, a large number of buffers for delay adjustment are inserted into clock supply wiring on the side closer to the supply source of the sample and hold clock signal, an area for the buffers is required, and a circuit size is increased.

Furthermore, when a large number of buffers are arranged in a wide range, variations of wirings on a chip surface, parasitic capacitances, and transistors are increased, and it is difficult to adjust timings until the sample and hold clock signal reaches each stage. In addition, since the timings at which the sample and hold clock signals are respectively supplied to the stages vary (variation is increased), it is necessary to adjust the timings between the stages in consideration of margins (timing margin) for the variation.

In addition, in a case where a large number of buffers are inserted into the clock supply wiring on the side closer to the clock supply source, a timing margin (setup time) to receive data by the data processing circuit 50 at the subsequent stage cannot be sufficiently secured, and this prevents acceleration.

In this way, in the semiconductor integrated circuit with the restriction described above, when a large number of buffers are inserted into the clock supply wiring on the side of the circuit closer to the clock source to match the sample and hold clock signal timings at the input ends of the sample and hold circuits, the insertion of the buffers causes the circuit size to be larger as the buffer is farther from the clock source. Due to the increase in the delay time of the sample and hold clock signal, the timing margin with the subsequent stage processing circuit (for example, data processing circuit 50) cannot be secured. In addition, there has been a disadvantage in that it is necessary to adjust the timing of the plurality of sample and hold circuits when clock timings are matched at the input ends of the sample and hold circuits.

Therefore, regarding the clock supply method when the physical positions of the plurality of sample and hold circuits are largely separated from each other, the semiconductor integrated circuit according to one embodiment of the present invention supplies the clock signal from the processing subsequent stage in the processing system formed of the plurality of sample and hold circuits. For example, the semiconductor integrated circuit according to one embodiment includes the plurality of processing circuits including the sample and hold circuit and the timing signal generation circuit which generates the timing signal to control the timing to operate the sample and hold circuit, and the timing signal generation circuit is connected to the plurality of processing circuits so as to supply the timing signals to the plurality of processing circuits in order from the subsequent stage circuit to the preceding stage circuit.

With this structure, it is not necessary to insert a large number of buffers for clock adjustment, and an increase in the circuit area can be suppressed. In addition, a timing margin with the processing circuit at the subsequent stage can be secured, and timing adjustment between the plurality of sample and hold circuits can be easily achieved. Embodiments will be described below.

First Embodiment

In a first embodiment, one mode for sequentially supplying timing signals from a subsequent stage circuit to a preceding stage circuit in a pipeline ADC will be described.

Figure 4:
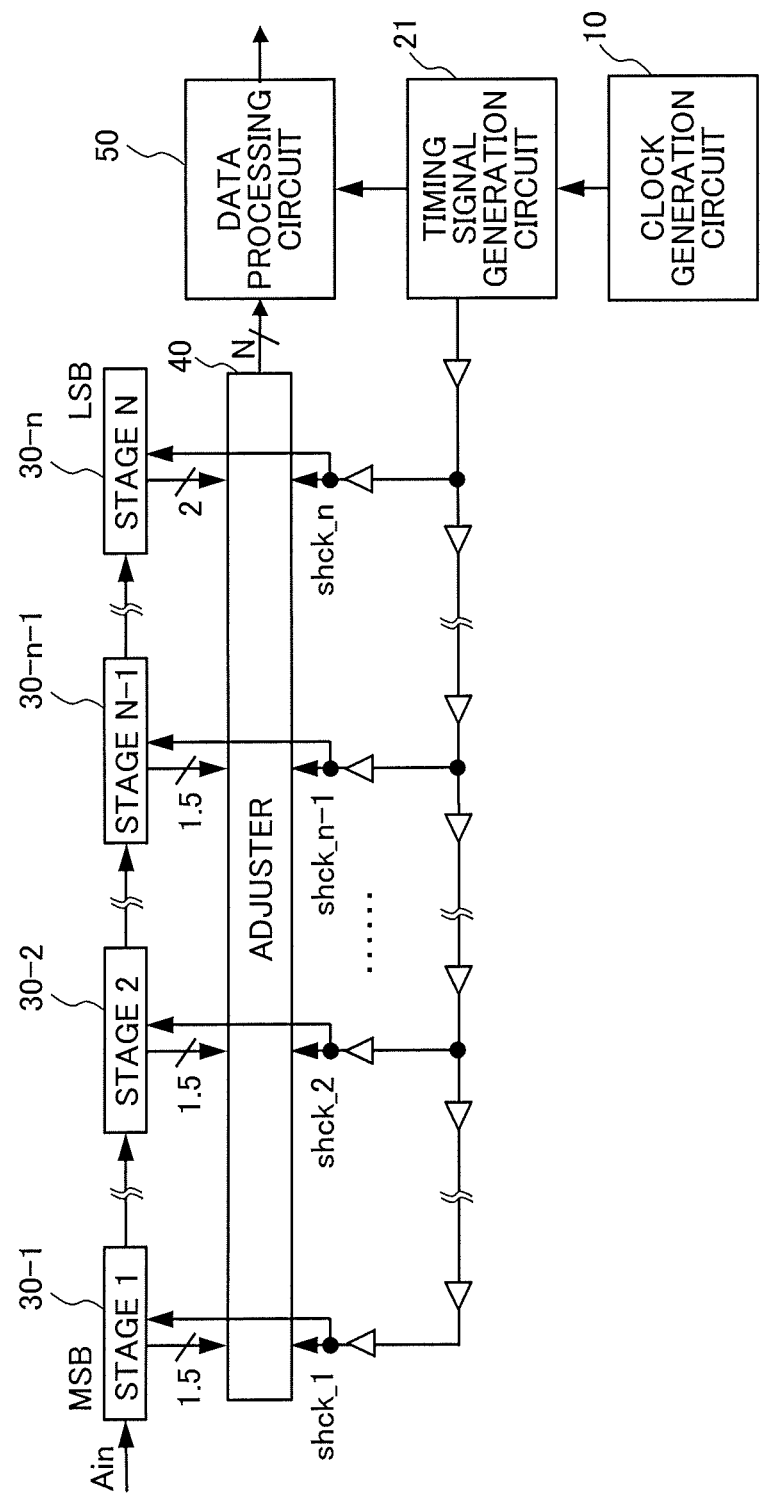
FIG. 4 is a diagram for explaining a configuration example of a semiconductor integrated circuit according to a first embodiment.

FIG. 4 is a diagram for explaining a configuration example of a semiconductor integrated circuit according to the first embodiment. FIG. 4 is a configuration example of the semiconductor integrated circuit to operate the pipeline ADC in a case where the timing signal is supplied to a subsequent stage when the semiconductor integrated circuit is physically restricted as described above.

The semiconductor integrated circuit includes a clock generation circuit 10, a timing signal generation circuit 21, stages 1(30-1) to N(30-n) (N and n are integers of one or more, the same applies to the following embodiments), an adjuster 40, and a data processing circuit 50. Hereinafter, the stage 1(30-1) is referred as a stage 1, the stage 2(30-2) is referred to as a stage 2, and similarly, the stage N(30-n) is referred to as a stage N.

The clock generation circuit 10 generates a reference clock and outputs a reference clock signal.

The timing signal generation circuit 21 receives the reference clock signal and generates a timing signal (for example, sample and hold clock signal) which instructs a timing to operate the sample and hold circuit based on the reference clock signal.

The stages 1 to N are examples of a plurality of processing circuits including the sample and hold circuit and serially execute processing from the preceding stage circuit to the subsequent stage circuit.

The adjuster 40 is a circuit which makes adjustment or correction, and for example, performs delay adjustment and data correction. The adjuster 40 includes, for example, a data correction circuit (digital correction circuit) and a delay adjustment circuit.

The data processing circuit 50 receives processing data output from the plurality of processing circuits (for example, stages 1 to N) including the sample and hold circuit and outputs the data to the subsequent stage. In FIG. 4, the data processing circuit 50 receives the data output from the stages 1 to N via the adjuster 40 as N-bit processing data.

Furthermore, the timing signal generation circuit 21 is connected to the stages to sequentially supply the timing signals to the plurality of stages 1 to N in order from the subsequent stage circuit to the preceding stage circuit. In addition, the timing signal generation circuit 21 is connected to the data processing circuit 50 to supply the timing signal.

For example, as illustrated in FIG. 4, in the semiconductor integrated circuit, clock supply lines (S/H clock supply line) are arranged which sequentially supply the timing signals (sample and hold clock signal) as control clocks from the subsequent stage to the preceding stage (for example, from stage N to stage 1 in order). With this structure, even when a distance between the stages is greatly long due to the layout restriction, an increase in the circuit size can be minimized, and the timing adjustment between the stages can be made in advance before the timing signal is supplied to each stage. In addition, a timing margin (setup time) with the data processing circuit 50 at the subsequent stage can be secured.

Figure 5:
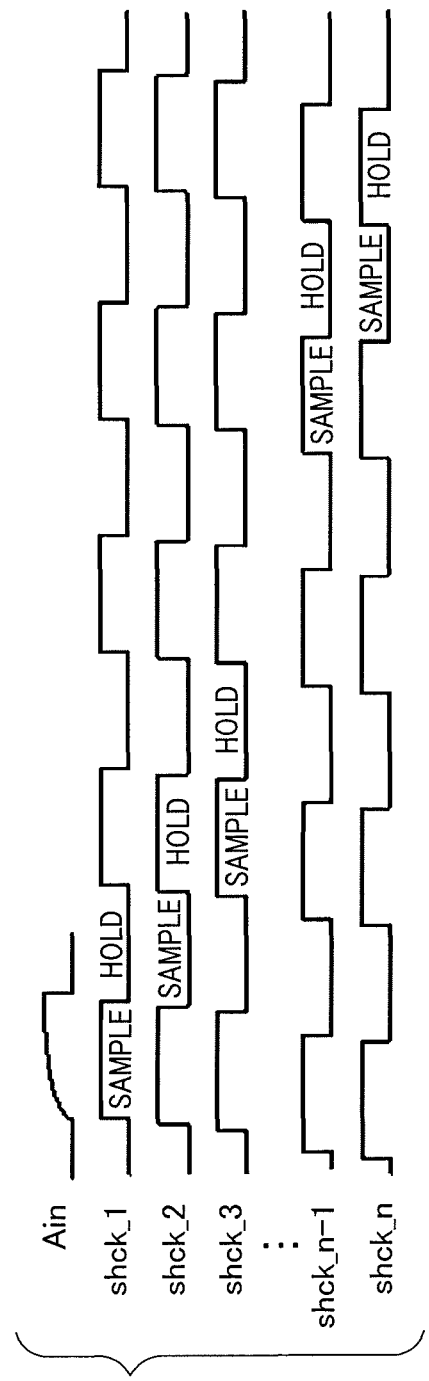
FIG. 5 is a timing chart for explaining an exemplary operation when a sample and hold clock signal is supplied from a subsequent stage.

FIG. 5 is a timing chart for explaining an exemplary operation when the sample and hold clock signal is supplied from the subsequent stage. FIG. 5 illustrates an example of a sample and hold timing to operate the pipeline ADC in a case where the clock signal is supplied from the subsequent stage when the semiconductor integrated circuit is physically restricted. As illustrated in FIG. 5, the timing signal is supplied from the subsequent stage so that it is possible to delay a clock timing signal of the preceding stage by a delay difference. Therefore, a hold timing of the subsequent stage can be matched a hold timing before the preceding stage samples the next data.

When it is required to largely separate physical positions of the stages due to the layout restriction, for example, in a case of a linear sensor, even in a case where comparison speed of each stage is increased, an output delay may be increased to adjust delays of clock signals to operate the sample and hold circuits of the respective stages. Such an output delay has caused a possibility that the subsequent stage processing circuit (for example, data processing circuit 50) cannot receive the processing data, it is difficult to secure the timing margin, and the speed cannot be sufficiently increased. In the present embodiment, since each circuit generates the sampling and holding timings based on the timing signal supplied from the subsequent stage circuit of the processing system and the timings of sampling and holding of the respective circuits can match, the timing margin with the subsequent stage processing circuit can be easily secured.

According to the present embodiment, in the processing system including the plurality of sample and hold circuits, the clock signal is supplied from the subsequent stage circuit of the processing system so as to suppress the increase in the circuit size and generate the sample and hold timings by each circuit. The timings of the plurality of circuits can be easily adjusted. In addition, the timing margin with the subsequent stage processing circuit can be easily secured.

Second Embodiment

In the first embodiment, the pipeline ADC has been described. Here, one mode of the other processing system in which sample and hold circuits are serially processed will be described.

Figure 6:
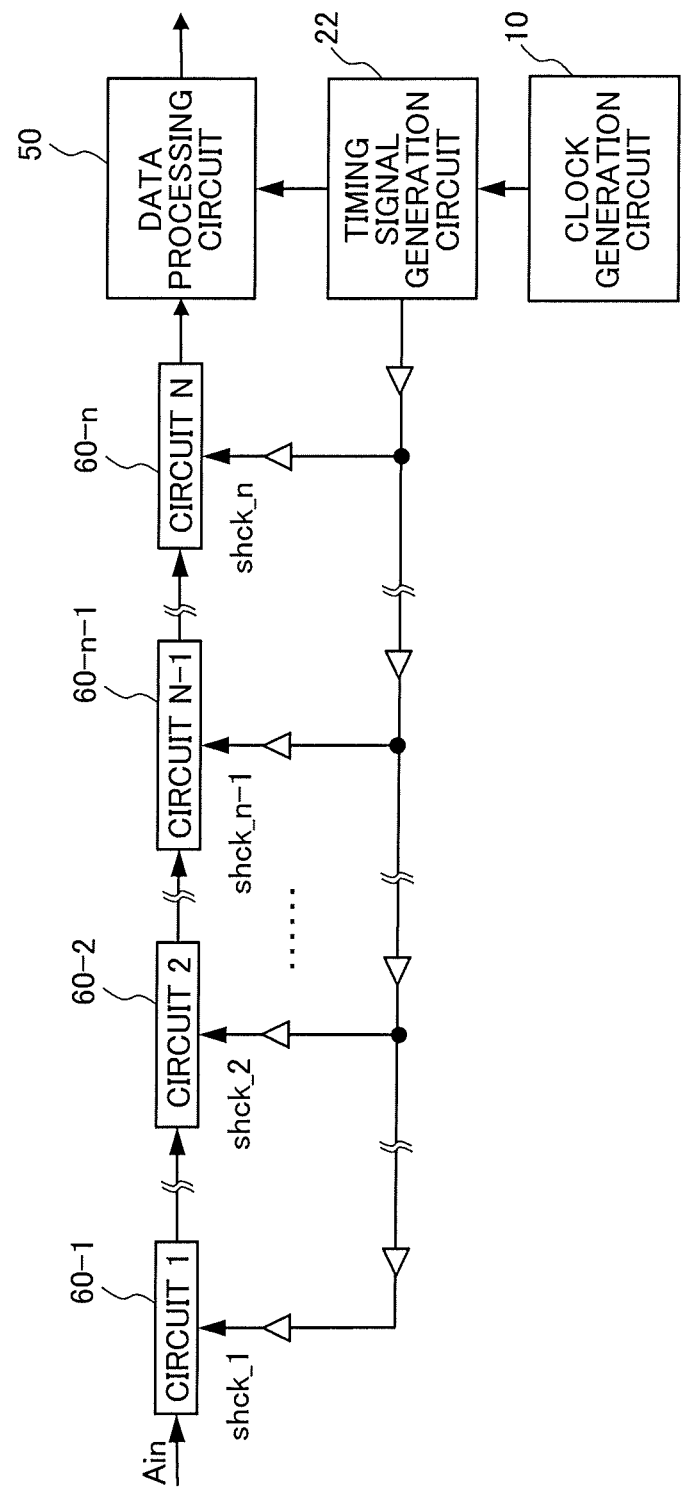
FIG. 6 is a diagram for explaining a configuration example of a semiconductor integrated circuit according to a second embodiment.

FIG. 6 is a diagram for explaining a configuration example of a semiconductor integrated circuit according to the second embodiment. FIG. 6 is a configuration example of a semiconductor integrated circuit which is physically restricted and a semiconductor integrated circuit to serially operate circuits including a S/H circuit in a case where a clock signal is supplied from a processing subsequent stage of a processing system.

The semiconductor integrated circuit includes a clock generation circuit 10, a timing signal generation circuit 22, a data processing circuit 50, and circuits 1(60-1) to N(60-*n*) as a plurality of processing circuits. Hereinafter, the circuit 1(60-1) is referred to as a circuit 1, the circuit 2(30-2) is referred to as a circuit 2, and similarly, the circuit N(30-*n*) is referred to as a circuit N.

The circuits 1 to N respectively include sample and hold circuits, are serially connected, and sequentially execute processing from the preceding stage to the subsequent stage. Each of the circuits 1 to N includes, for example, the sample and hold circuit illustrated in FIG. 1C.

The timing signal generation circuit 22 is connected to the circuits 1 to N to supply timing signals (for example, sample and hold clock signal) to the circuits 1 to N in order from the subsequent stage circuit to the preceding stage circuit.

The data processing circuit 50 receives processing data (for example, processing data output from circuits including circuit 1 to N to subsequent stage circuit in order) output from the plurality of processing circuits from the circuit N.

As in the first embodiment, the sample and hold clock signals as the timing signals are supplied from the subsequent stage circuit to the preceding stage circuit so that it is possible to delay a clock timing of the preceding stage circuit by a delay difference. Therefore, a hold timing of the subsequent stage circuit can be matched a hold timing before the preceding stage circuit samples next data.

In addition, in a processing system in which the sample and hold circuits are serially processed, a similar effect can be obtained if the clock signal is supplied from the subsequent stage in the system even if the number of circuits is one or more.

For example, the timing signals are supplied from the subsequent stage of the processing system including the sample and hold circuits so that a timing for supplying a sample and hold clock signal shck_n−1 to the circuit N−1 at a preceding stage is constantly delayed relative to a sample and hold clock signal shck_n supplied (input) to the circuit N in FIG. 6. On the other hand, even if data output from the circuit N−1 is output to the circuit N at a time zero (with no time difference from supply of sample and hold clock signal), the timing of supplying the sample and hold clock signal shck_n−1 to the circuit N−1 is delayed from the sample and hold clock signal supplied to the circuit N. Therefore, there is no missed signal. For example, even though physical positions of the sample and hold circuits are not largely separated from each other, clocks are sequentially supplied from the subsequent stage of the processing system so that timings of sampling and holding of the circuits can be secured.

According to the present embodiment, as in the first embodiment, it is possible to suppress an increase in the circuit area and to easily match the sample and hold timings of the plurality of processing circuits including the S/H circuits.

In a processing system having the sample and hold circuits which are serially processed, even when a functional block such as a Programable Gain Amplifier (PGA) is connected to the preceding stage, without limiting to a stage in the same functional block, the similar effect can be obtained. For example, the processing system including the circuits 1 to N may have a structure in which the circuit 1 is a PGA and subsequent circuits (circuits 2 to N) are pipeline ADCs.

Here, to serially execute processing from the preceding stage circuit to the subsequent stage circuit is to sequentially execute processing by circuits in an analog signal-reception order in the processing system, for example, when the processing system includes the circuits 1 to N, the processing is executed by the circuit 1, the circuit 2, . . . , the circuit N−1, and the circuit N in this order. The order from the subsequent stage circuit to the preceding stage circuit is an order opposite to the analog signal-reception order in the processing system, and for example, when the processing system includes the circuits 1 to N, the order is from the circuit N, the circuit N−1, . . . , the circuit 2, and the circuit 1.

Third Embodiment

In a third embodiment, a configuration example in which a control circuit is added to the configuration example according to the second embodiment will be described.

Figure 7:
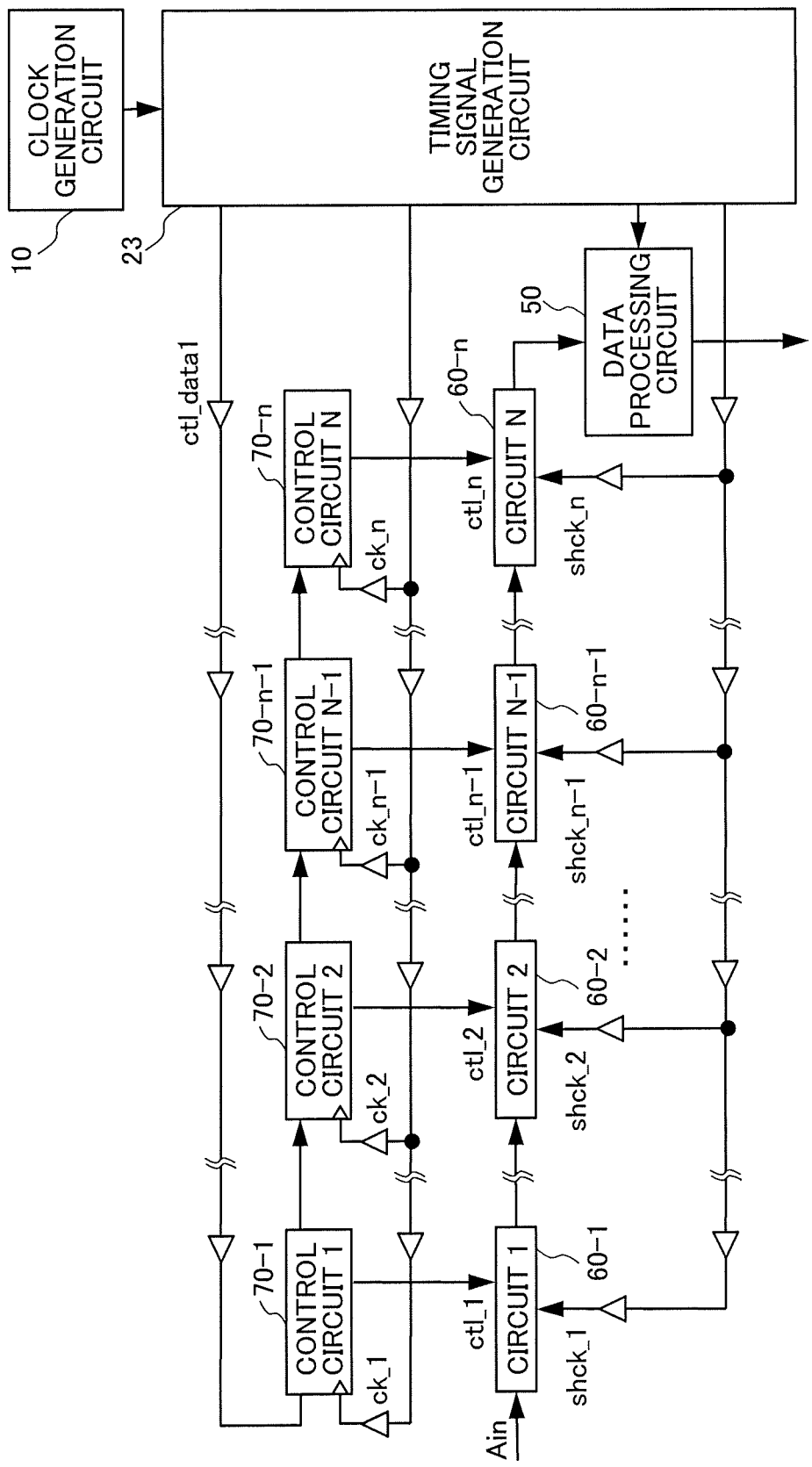
FIG. 7 is a diagram for explaining a configuration example of a semiconductor integrated circuit according to a third embodiment.

FIG. 7 is a diagram for explaining a configuration example of a semiconductor integrated circuit according to the third embodiment. FIG. 7 is a configuration example of a semiconductor integrated circuit which is physically restricted and a semiconductor integrated circuit in a case where a clock signal is supplied from a processing subsequent stage of a processing system and a control signal to a control circuit including a S/H circuit is supplied from the processing subsequent stage.

The semiconductor integrated circuit includes a clock generation circuit 10, a timing signal generation circuit 23, a data processing circuit 50, circuits 1 to N as a plurality of processing circuits, and control circuits 1(70-1) to N(70-N) as the plurality of control circuits. In the present embodiment, the control circuit 1(70-1) is referred to as a control circuit 1, the control circuit 2(70-2) is referred to as a control circuit 2, and similarly, the control circuit N(70-*n*) is referred to as a control circuit N. The semiconductor integrated circuit in FIG. 7 is a configuration example in which the control circuits 1 to N are added to the configuration in FIG. 4.

The control circuits 1 to N are the plurality of control circuits each including a sequential logic circuit, are serially connected to the circuits 1 to N to control the circuits 1 to N.

The timing signal generation circuit 23 is connected to the plurality of control circuits so as to supply control clock signals based on a timing signal (for example, sample and hold clock signal) to the control circuits in order from the control circuit N at the subsequent stage to the control circuit 1 in the preceding stage. The timing signal generation circuit 23 may use, for example, the sample and hold clock signal as a timing signal as a control clock signal which controls the plurality of control circuits and may generate a control clock signal based on the sample and hold clock signal. Furthermore, the timing signal generation circuit 23 is connected so as to supply control data (ctl_data1) to a first stage circuit (control circuit 1) of the plurality of control circuits based on the timing signal.

As illustrated in FIG. 7, not only the sample and hold clock signal, but also a control clock signal (ck_1, . . . , ck_n) and the control data (ctl_data1) may be supplied from the processing system subsequent stage (sequential logic circuit subsequent stage) by providing a corresponding sequential logic circuit to control the circuit group (ctl_1, . . . , ctl_n), similarly to the sample and hold clock signal.

Circuits 1 to N in FIG. 7 are included in the circuit group including the sample and hold circuits, and the control circuits 1 to N are sequential logic circuits to respectively control the circuits 1 to N.

According to the present embodiment, in addition to the sample and hold timings, control timings at which the control circuits respectively control S/H circuits can be easily matched.

Fourth Embodiment

In a fourth embodiment, a configuration example in which an analog signal which is parallel-to-serial converted by a parallel-to-serial (parallel/serial) conversion circuit is input to a S/H circuit will be described.

Figure 8:
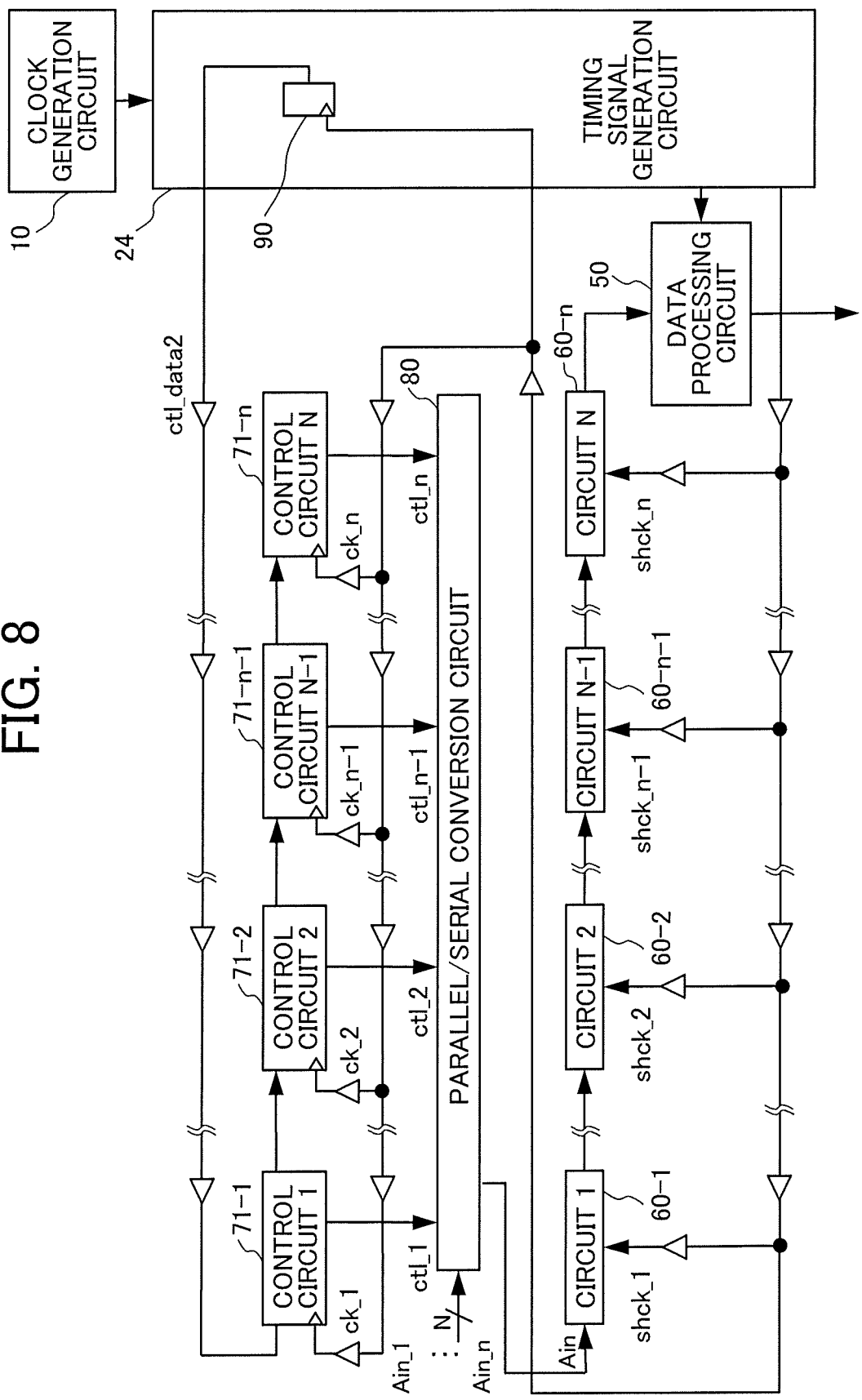
FIG. 8 is a diagram for explaining a configuration example of a semiconductor integrated circuit according to a fourth embodiment.
Figure 9:
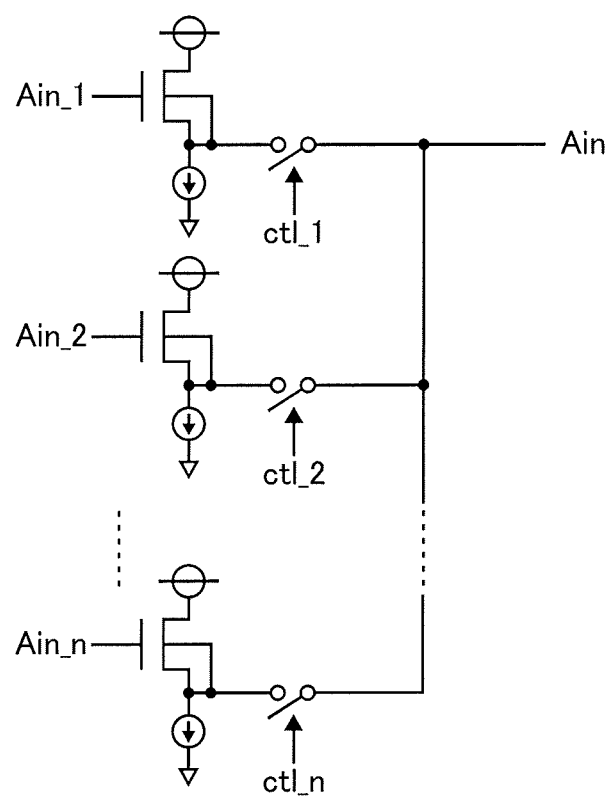
FIG. 9 is a diagram for explaining an example of a parallel/serial conversion circuit in FIG. 8.
Figure 10:
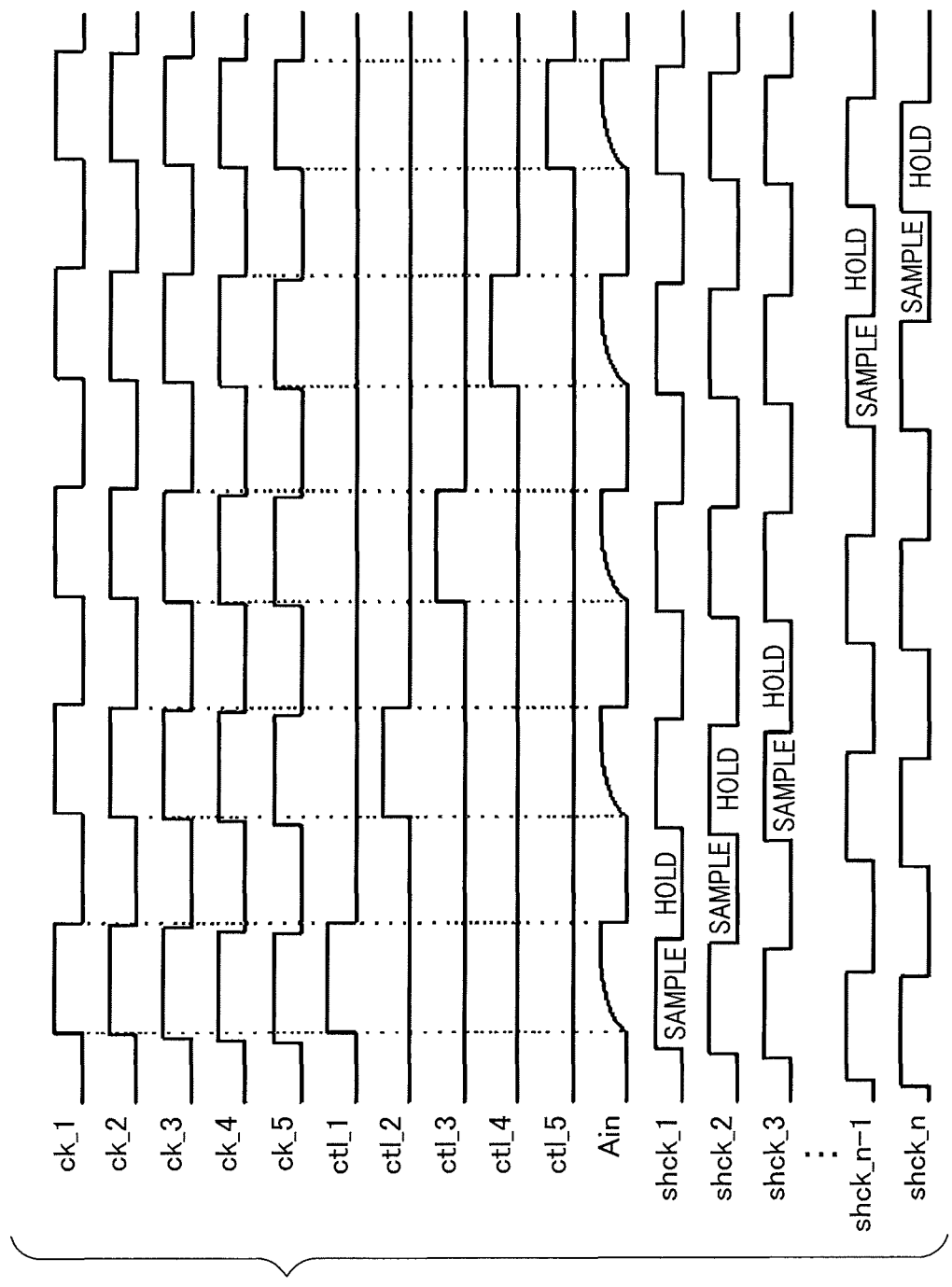
FIG. 10 is a timing chart for explaining an exemplary operation of the semiconductor integrated circuit according to the fourth embodiment.

FIG. 8 is a diagram for explaining a configuration example of a semiconductor integrated circuit according to the fourth embodiment. FIG. 9 is a diagram for explaining an example of the parallel/serial conversion circuit in FIG. 8. FIG. 10 is a timing chart for explaining an exemplary operation of the semiconductor integrated circuit according to the fourth embodiment.

FIG. 8 is a configuration example of a semiconductor integrated circuit which is physically restricted and a semiconductor integrated circuit in which the parallel/serial conversion circuit receives a plurality of analog signals (Ain_1 to Ain_n), the plurality of control circuits controls the parallel/serial conversion circuit, and a retiming circuit controls the plurality of control circuits based on the sample and hold clock signal (based on sample and hold clock signal reference).

The semiconductor integrated circuit includes a clock generation circuit 10, a timing signal generation circuit 24, a data processing circuit 50, circuits 1 to N as a plurality of processing circuits, control circuits 1(71-1) to N(71-n) as a plurality of control circuits, a parallel/serial conversion circuit 80, and a retiming circuit 90. In the present embodiment, the control circuit 1(71-1) is referred to as a control circuit 1, the control circuit 2(71-2) is referred to as a control circuit 2, and similarly, the control circuit N(71-n) is referred to as a control circuit N.

The control circuits 1 to N control the parallel/serial conversion circuit 80.

The retiming circuit 90 is connected so as to receive a sample and hold clock signal shck_1 (timing signal) supplied to a first stage of the circuit 1. Furthermore, the retiming circuit 90 is connected so as to supply control data (ctl_data2) as a reference signal (reference value, reference data) of the plurality of control circuits to the first stage (control circuit 1) of the plurality of control circuits based on the received sample and hold clock signal shck_1.

For example, in FIG. 8, a case is illustrated where a signal input to a first part (first stage circuit, for example, circuit 1) of a processing system including a S/H circuit is output from the parallel/serial conversion circuit as illustrated in FIG. 9.

The timing signal generation circuit 24 is connected to the control circuits 1 to N so that control clock signals ck_1 to ck_n with reference to the sample and hold clock signal shck_1 is input (supply) to the control circuits 1 to N from the control circuit N at the subsequent stage (for example, supply control clock signals ck_n, ch_n–1, . . . , and ck_1 in this order). For example, as illustrated in FIG. 8, in the semiconductor integrated circuit, clock supply lines (control clock supply line) are arranged so that after supplying the sample and hold clock signal to the circuit 1, the timing signal generation circuit 24 supplies the signal to the control circuit N and sequentially supplies the signals to the control circuit at the preceding stage.

The retiming circuit 90 inputs the control data (ctl_data2) synchronized with the sample and hold clock signal shck_1 from the side of the control circuit 1. As a result, as illustrated in FIG. 10, an output of the parallel/serial conversion circuit 80 is input to the circuit 1 as an analog signal (Ain), and the circuit 1 can constantly sample and hold data before the parallel/serial conversion on the data is completed.

According to the present embodiment, since the control clock signal and the control data (reference signal, reference value, reference data) are generated with reference to a first stage clock (sample and hold clock signal shck_1) of the S/H circuit, a control timing of the parallel/serial conversion circuit can be easily matched an input timing of the S/H circuit first stage (for example, circuit 1).

In FIG. 8, the configuration example has been illustrated in which the retiming circuit 90 is arranged in the timing signal generation circuit 24. However, the retiming circuit 90 may be arranged as a circuit different from the timing signal generation circuit 24, and the timing signal generation circuit 24 may execute the function of the retiming circuit 90.

Other Embodiments

In the above embodiments, the clock signal (for example, timing signal and control clock signal) is supplied to the sample and hold circuits from the subsequent stage in the processing system in the semiconductor integrated circuit. However, when the blocks in the processing system are more widely separated from each other, the clock signal may be supplied by using wiring provided outside the semiconductor integrated circuit. For example, after the clock signal has been temporarily output to the outside of the semiconductor integrated circuit, the clock signal may be supplied by, for example, an interposer of a package and may be supplied via a Printed Circuit Board (PCB). With this structure, it is possible to reduce a significant delay caused by the wiring (clock supply line) and a buffer.

For example, in a case where the sample and hold circuits are separated from each other, it is preferable to provide a supply path of the clock signal between the adjacent circuits in the package or in the PCB. Furthermore, for example, in a case where the adjacent circuits M−1 and M (M is integer of one to N) of the circuits 1 to N are separated from each other, it is preferable to provide a supply path of the clock signal between the circuits M−1 and M in the package or in the PCB. This can further reduce the delay than a case where the wiring of the clock supply line and the buffer are arranged in a chip.

In addition, in the above embodiments, the clock supply method according to one embodiment of the present invention is the clock supply method of the semiconductor integrated circuit which includes the plurality of processing circuits (for example, circuits 1 to N) which includes the sample and hold circuit and serially executes processing from the preceding stage circuit to the subsequent stage circuit and the timing signal generation circuit 22 which receives the reference clock signal and generates the timing signal (for example, sample and hold clock signals shck_1 to shck_n) to control the timing to operate the sample and hold circuit based on the reference clock signal, and the timing signal generation circuit 22 supplies the timing signals to the plurality of processing circuits in an order from the subsequent stage circuit to the preceding stage circuit (for example, order from circuit n to circuit 1).

In the above embodiments, the configuration example has been described in which the clock generation circuit 10 is arranged in the semiconductor integrated circuit. However, the timing signal generation circuits 21 to 24 may receive the reference clock signals from outside.

In the third and fourth embodiments, it has been described that the number of the plurality of processing circuits (for example, circuits 1 to N) is the same as the number of the plurality of control circuits (for example, control circuits 1(70-1) to N(70-n) or control circuits 1(71-1) to N(71-n)). However, a case where the number of processing circuits is different from the number of control circuits is not excluded, and the number of processing circuits may be different from the number of control circuits.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A semiconductor integrated circuit comprising:
a plurality of processing circuits including a sample and hold circuit; and
a timing signal generation circuit configured to receive a reference clock signal and generate a timing signal to control a timing to operate the sample and hold circuit based on the reference clock signal,
wherein the plurality of processing circuits serially execute processing in order from the processing circuit at a preceding stage to the processing circuit at a subsequent stage, and
the timing signal generation circuit is coupled to the plurality of processing circuits so as to supply the timing signal to each of the plurality of processing circuits in order from the processing circuit at the subsequent stage to the processing circuit at the preceding stage,
the semiconductor integrated circuit further comprising a plurality of control circuits each including a sequential logic circuit and serially connected to the plurality of processing circuits,
wherein the timing signal generation circuit is coupled to the plurality of control circuits to supply control clock signals to the control circuits based on the timing signal in order from the control circuit at the subsequent stage to the control circuit at the preceding stage.

2. The semiconductor integrated circuit according to claim 1 further comprising:
a data processing circuit configured to receive processing data output from the plurality of processing circuits,
wherein the timing signal generation circuit is coupled to the data processing circuit so as to supply the timing signal to the data processing circuit.

3. The semiconductor integrated circuit according to claim 1, further comprising:
a parallel-to-serial conversion circuit configured to convert parallel data into serial data and input the data to the processing circuit at a first stage of the stages; and
a retiming circuit configured to receive the timing signal that has been supplied to the processing circuit at the first stage, and to supply a reference signal of the plurality of control circuits to the control circuit at the first stage based on the received timing signal,
wherein the plurality of control circuits serially execute processing from the control circuit at the first stage based on the reference signal output from the retiming circuit and control the parallel-to-serial conversion circuit, and
the timing signal generation circuit is configured to supply the timing signal to each of the plurality of control circuits after supplying the timing signal as the control clock signal to the processing circuit at the first stage.

4. The semiconductor integrated circuit according to claim 1,
wherein a supply path to supply the timing signal is provided in a package.

5. The semiconductor integrated circuit according to claim 1,
wherein a supply path to supply the timing signal is provided in a printed wiring board.

6. A clock supply method of a semiconductor integrated circuit comprising:
at a plurality of processing circuits including a sample and hold circuit, serially executing processing in order from the processing circuit at a preceding stage to the processing circuit at a subsequent stage;
at a timing signal generation circuit, generating a timing signal to control a timing to operate the sample and hold circuit based on a reference clock signal; and
at the timing signal generating circuit, supplying the timing signal to each of the plurality of processing circuits in order from the processing circuit at the subsequent stage to the processing circuit at the preceding stage,
the method further comprising supplying, by the timing generation signal circuit control clock signals to a plurality of control circuits, each including a sequential logic circuit and serially connected to the plurality of processing circuits, based on the timing signal in order from the control circuit at the subsequent stage to the control circuit at the preceding stage.

7. The method according to claim 6, further comprising:
receiving, at a data processing circuit, processing data output from the plurality of processing circuits; and
supplying, by the timing signal generation circuit which is couples to the data processing circuit, the timing signal to the data processing circuit.

8. The method according to claim 6, further comprising:
at a parallel-to-serial conversion circuit, performing converting, by a parallel-to-serial conversion circuit, parallel data into serial data and inputting the data to the processing circuit at a first stage of the stages; and
receiving, by a retiming circuit, the timing signal that has been supplied to the processing circuit at the first stage, and supplying a reference signal of the plurality of control circuits to the control circuit at the first stage based on the received timing signal,
wherein the plurality of control circuits serially execute processing from the control circuit at the first stage based on the reference signal output from the retiming circuit and control the parallel-to-serial conversion circuit, and
wherein the timing signal generation circuit supplies the timing signal to each of the plurality of control circuits after supplying the timing signal as the control clock signal to the processing circuit at the first stage.

9. The method according to claim 6, wherein a supply path to supply the timing signal is provided in a package.

10. The method according to claim 6, wherein a supply path to supply the timing signal is provided in a printed wiring board.

* * * * *